United States Patent
Kojima et al.

(10) Patent No.: US 7,846,839 B2
(45) Date of Patent: Dec. 7, 2010

(54) FILM FORMING METHOD, SEMICONDUCTOR DEVICE MANUFACTURING METHOD, SEMICONDUCTOR DEVICE, PROGRAM AND RECORDING MEDIUM

(75) Inventors: Yasuhiko Kojima, Nirasaki (JP); Naoki Yoshii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 598 days.

(21) Appl. No.: 11/718,100

(22) PCT Filed: Oct. 3, 2005

(86) PCT No.: PCT/JP2005/018287

§ 371 (c)(1),
(2), (4) Date: Apr. 27, 2007

(87) PCT Pub. No.: WO2006/046386

PCT Pub. Date: May 4, 2006

(65) Prior Publication Data

US 2009/0032950 A1 Feb. 5, 2009

(30) Foreign Application Priority Data

Oct. 27, 2004 (JP) .............................. 2004-312497

(51) Int. Cl.
*H01L 21/44* (2006.01)
(52) U.S. Cl. .................. 438/680; 438/626; 438/648; 438/656; 438/678; 438/685; 257/E21.584

(58) Field of Classification Search .................. 438/650
See application file for complete search history.

(56) References Cited

U.S. PATENT DOCUMENTS

| 5,306,666 | A   | * | 4/1994 | Izumi .......................... 438/680 |
| 6,249,055 | B1  | * | 6/2001 | Dubin .......................... 257/758 |
| 6,362,099 | B1  |   | 3/2002 | Gandikota et al. |
| 2002/0050459 | A1 | * | 5/2002 | Matsuda et al. ............. 205/118 |
| 2002/0090814 | A1 |   | 7/2002 | Inoue et al. |
| 2002/0119657 | A1 |   | 8/2002 | Gandikota et al. |
| 2003/0157750 | A1 | * | 8/2003 | Narukawa ................... 438/118 |
| 2005/0124154 | A1 | * | 6/2005 | Park et al. ................... 438/643 |

FOREIGN PATENT DOCUMENTS

| JP | 2000 260865  | 9/2000 |
| JP | 2001 23989   | 1/2001 |
| JP | 2002 203859  | 7/2002 |
| JP | 2004-193499  | 7/2004 |

* cited by examiner

*Primary Examiner*—N Drew Richards
*Assistant Examiner*—Kyoung Lee
(74) *Attorney, Agent, or Firm*—Oblon, Spivak, McClelland, Maier & Neustadt, L.L.P.

(57) ABSTRACT

An adhesion between a Cu diffusion barrier film and a Cu wiring in a semiconductor device is improved and reliability of the semiconductor device is improved. A film forming method for forming a Cu film on a substrate to be processed is provided with a first process of forming an adhesion film on the Cu diffusion barrier film formed on the substrate to be processed, and a second process of forming a Cu film on the adhesion film. The adhesion film includes Pd.

18 Claims, 12 Drawing Sheets

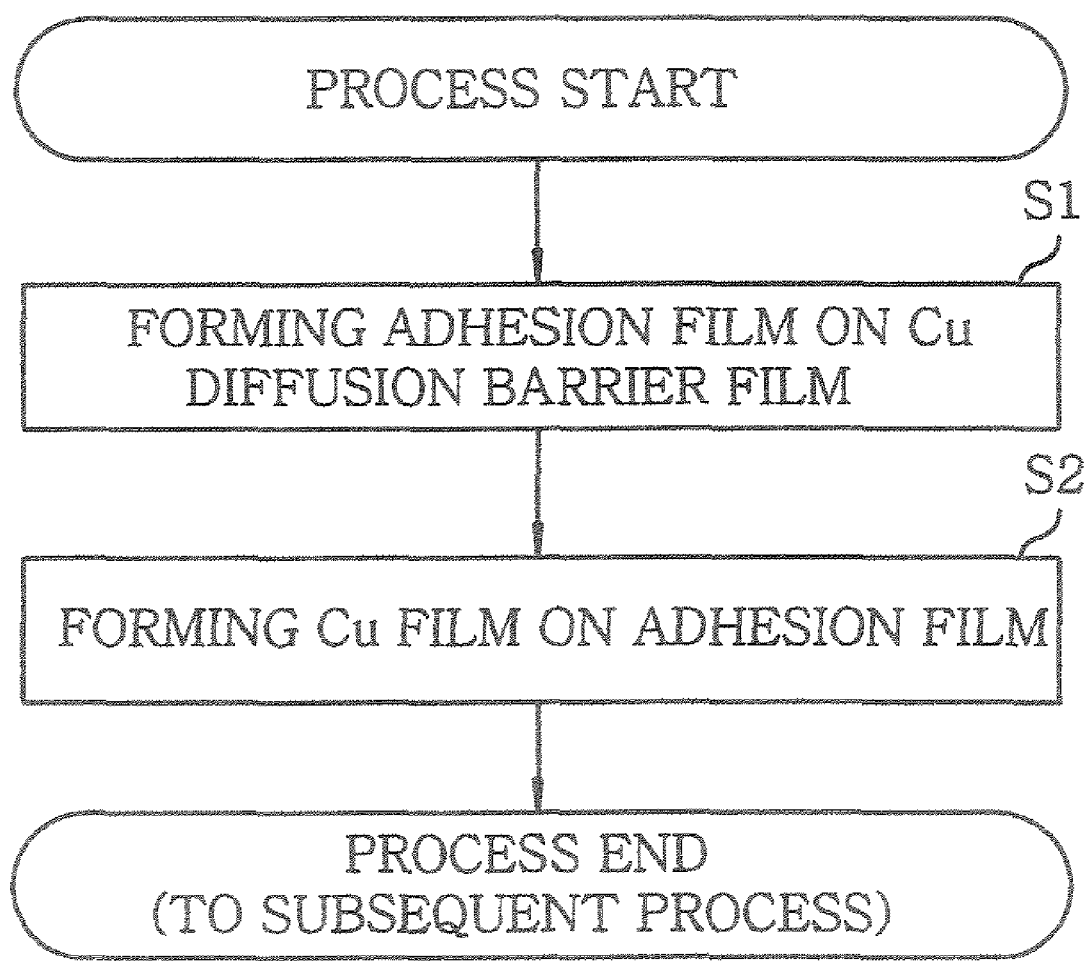

FILM FORMING METHOD, SEMICONDUCTOR DEVICE MANUFACTURING METHOD, SEMICONDUCTOR DEVICE, PROGRAM AND RECORDING MEDIUM

FIELD OF THE INVENTION

The present invention relates to a film forming method for forming a Cu film on a Cu diffusion barrier film formed on a substrate to be processed, a semiconductor device using the film forming method and a manufacturing method therefor, a program for operating the film forming method, and a storage medium for storing the program.

BACKGROUND OF THE INVENTION

Recent trend for achieving an ever higher performance of a semiconductor device accompanied with progress in realizing high integration density thereof markedly increases the pressure for further miniaturization therefor. Developments are being made with design rules in a range of 0.1 µm or less. Further, copper (Cu), which causes less interconnection delay and is of a low resistance, is being used as an interconnection material.

Therefore, the combination of a Cu film forming technique and a micro-interconnection technique has become an important key technology in a multi-layer interconnection technique that is getting further miniaturized recently.

If, for example, Cu wiring is used for the interconnection in a semiconductor device and the like, Cu is likely to be diffused into an insulating film formed around the Cu wiring. For this reason, a Cu diffusion barrier film (also called as a barrier film or an under layer) is usually formed between the Cu wiring and the insulating film.

Patent Document 1: Japanese Patent Laid-Open Application No. 2004-193499

However, in this case, the Cu wiring is not strongly adhered to a conventional Cu diffusion barrier film such as a Ta film or a TaN film, and a film peeling can develop between the Cu wiring and the Cu diffusion barrier film, thereby deteriorating, for example, the reliability of a semiconductor device.

In addition to the film peeling in a semiconductor device manufacturing process, an agglomeration of Cu wiring, for example, may occur after a thermal process has been performed. In such a Cu wiring formed to be agglomerated and weakly adhered to the under layer, when a current density that flows into the Cu wiring becomes high, the interconnection may be deteriorated by an electromigration due to a surface diffusion of electron, and may be deteriorated or damaged by a stress migration.

In this regard, for example, a method has been attempted to form an adhesion film made of ruthenium (Ru) between the Cu diffusion barrier film and the Cu wiring. However, the method has not been successful to provide a sufficiently strong adhesion between the Cu diffusion barrier film and the Cu wiring. Moreover, since the method cannot satisfactorily solve the problem of the agglomeration of Cu, it is not yet adequate for a practical use.

SUMMARY OF THE INVENTION

It is, therefore, an object of the present invention to provide a novel and useful film forming method, a semiconductor device using the film forming method and a manufacturing method therefor, a program for operating the film forming method and a storage medium for storing the program.

It is a more specific object of the present invention to provide a film forming method capable of improving an adhesion between a Cu diffusion barrier film and a Cu wiring, a semiconductor device using the film forming method and a manufacturing method therefor, a program for operating the film forming method, and a storage medium for storing the program.

In accordance with a first aspect of the present invention, the object is achieved by providing a film forming method of forming a Cu film on a substrate to be processed, including a first step of forming an adhesion film on a Cu diffusion barrier film formed on the substrate to be processed; and a second step of forming the Cu film on the adhesion film, wherein the adhesion film includes Pd.

In accordance with a second aspect of the present invention, the object is achieved by providing a method of manufacturing a semiconductor device having a Cu wiring portion, including a first step of forming an adhesion film on a Cu diffusion barrier film formed along a pattern shape formed in an insulating film on a substrate to be processed; and a second step of forming the Cu wiring portion on the adhesion film, wherein the adhesion film includes Pd.

In accordance with a third aspect of the present invention, the object is achieved by providing a semiconductor device including an insulating film formed on a substrate to be processed; a Cu wiring portion formed in the insulating film; and a Cu diffusion barrier film formed between the insulating film and the Cu wiring portion, wherein an adhesion film including Pd is formed between the Cu wiring portion and the Cu diffusion barrier film.

In accordance with a fourth aspect of the present invention, the object is achieved by providing a program for having a computer to execute a film forming method by using a film forming apparatus for forming an adhesion film including Pd between a Cu diffusion barrier film and a Cu wiring portion formed on a substrate to be processed, including a film forming gas supplying step of supplying a film forming gas to the substrate to be processed; a film forming gas removing step of removing the film forming gas over the substrate to be processed; a reducing gas supplying step of supplying a reducing gas to the substrate to be processed; and a reducing gas removing step of removing the reducing gas over the substrate to be processed.

In accordance with a fifth aspect of the present invention, the object is achieved by providing a film forming apparatus for forming an adhesion film including Pd between a Cu diffusion barrier film and a Cu wiring portion formed on a substrate to be processed comprising a controller which performs a film forming gas supplying step of supplying a film forming gas to the substrate to be processed; a film forming gas removing step of removing the film forming gas over the substrate to be processed; a reducing gas supplying step of supplying a reducing gas to the substrate to be processed; and a reducing gas removing step of removing the reducing gas over the substrate to be processed.

In accordance with the present invention, the adhesion between a Cu diffusion barrier film and a Cu wiring in a semiconductor device can be enhanced, so that the reliability of the semiconductor device can be improved.

BRIEF DESCRIPTION OF THE DRAWINGS

The above and other objects and features of the present invention will become apparent from the following description of embodiments given in conjunction with the accompanying drawings, in which:

FIG. 1 shows a flow chart of a film forming method in accordance with a first embodiment of the present invention;

EXPLANATION OF REFERENCE SYMBOLS

Figure 2A:
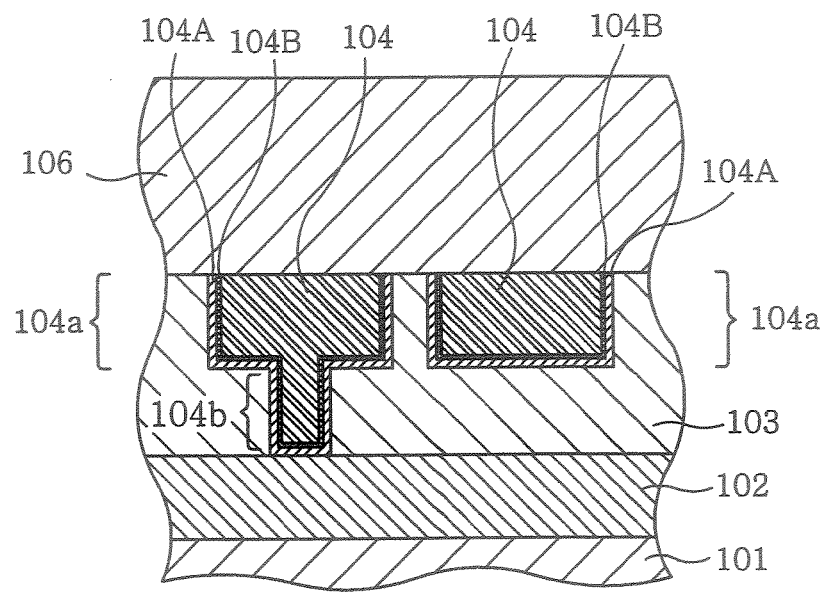
FIG. 2A illustrates a first one of drawings for sequentially illustrating a method of manufacturing a semiconductor device in accordance with the first embodiment.

10: CVD film forming apparatus
20: ALD film forming apparatus
11, 21: processing chamber
12, 22: supporting table
12A, 22A: heating unit
13: supply unit
13A: gas holes
23: shower head part
23A, 23B, 24a, 29a: insulator
28: source material container
28A: source material
32: high frequency power supply
10S 20S: controller
HD1, HD2: storage medium
15, 16, 17, 24, 25, 26, 27, 29, 30, 31: supply line
15A, 16A, 17A, 25A, 25B, 26A, 26B, 27A, 30A, 30B, 31A, 31B: valve
25C, 26D, 30C, 31C: mass flow controller
26C: vaporizer
101: silicon oxide film
102: wiring portion
103, 106: insulating film
104, 107: wiring portion
104a, 107a: groove portion
104b, 107b: hole
104A, 107A: Cu diffusion barrier film
104B, 107B: adhesion film

DETAILED DESCRIPTION OF THE EMBODIMENTS

Hereinafter, embodiments of the present invention will be described in detail with reference to the accompanying drawings so that they can be readily implemented by those skilled in the art.

First Embodiment

FIG. 1 is a flow chart of a film forming method in accordance with a first embodiment of the present invention.

Referring to FIG. 1, a process is started, and, in step S1, an adhesion film is formed on a Cu diffusion barrier film formed on a substrate to be processed. For example, the Cu diffusion barrier film is formed along a pattern shape of an insulating film formed on the substrate. The adhesion film is made of a material with characteristics that can make it be strongly adhered to the Cu diffusion barrier film as well as to a Cu film that is to be formed in a subsequent step.

Next, in step S2, a Cu film is formed on the adhesion film formed in the step S1, and also for example, a Cu wiring is formed. If necessary, after the Cu film and the Cu wiring are formed in the step S2, for example, a CMP (Chemical-Mechanical Polishing) process is performed, or a process of forming an upper layer interconnection structure is performed after the CMP process to thereby form, e.g., a semiconductor device of a multi-layer interconnection structure.

Although ruthenium (Ru) has conventionally been used as a material forming the adhesion film, it has been successful neither in providing a sufficiently strong adhesion between the Cu diffusion barrier film and the Cu film nor in satisfactorily suppressing the agglomeration of Cu.

On the other hand, in the film forming method in accordance with the first embodiment of the present invention, a film including palladium (Pd) is used as the adhesion film. If the adhesion film includes Pd, an alloying process of Pd with Cu, which are active metals, are easily facilitated at places close to an interface between the adhesion film and Cu. As a result, the adhesion of Cu to the adhesion film is expected to be improved. Further, the inventors have observed that the adhesion becomes stronger when Pd is used for the adhesion film than when other materials are used therefor. It is considered that, in this case, the agglomeration of Cu is suppressed to reduce the electromigration and the stress migration.

Further, in accordance with the film forming method of the present embodiment, since a surface of the Cu diffusion barrier film is protected by the adhesion film including Pd, the Cu diffusion barrier film is prevented from being oxidized even when, for example, the substrate is exposed to an atmosphere that contains oxygen before forming the Cu wiring. If, for example, a film including tantalum (Ta) is used for the Cu diffusion barrier film, when the Cu diffusion barrier film is exposed to an atmosphere that contains oxygen, Ta is easily oxidized to thereby form an oxide of Ta on the Cu diffusion barrier film. The oxide of Ta cannot be strongly adhered to the Cu film, and, after the Cu film is formed, may develop a peeling thereof. Moreover, in some cases, a specific resistance of the Cu diffusion barrier film increases by the formation of the oxide of Ta.

In contrast, the adhesion film including Pd is not so easily oxidized as, for example, Ta. Further, even when the adhesion film including Pd is oxidized, since an oxide of Pd has a lower specific resistance than that of the oxide of Ta, an increase in the specific resistance of the Cu diffusion barrier film including the adhesion film is suppressed. Thus, the device properties are prevented from being deteriorated.

In the following, an exemplary manufacturing process for a semiconductor device by using the film forming method in accordance with the first embodiment will be described.

FIGS. 2A to 2E sequentially illustrate an exemplary manufacturing process of a semiconductor device by using the film forming method shown in FIG. 1.

Firstly, as shown in FIG. 2A, an insulating film such as a silicon oxide film 101 is formed to cover element(s) (not shown) such as an MOS transistor formed on a semiconductor substrate (a substrate to be processed) made of silicon or the like. A wiring layer (not shown) made of, e.g., tungsten, is formed to be electrically connected to the above-mentioned element(s), and another wiring layer 102 made of, e.g., Cu, is formed to be connected to the wiring layer (not shown).

Further, a first insulating film 103 is formed on the silicon oxide film 101 to cover the wiring layer 102. In the insulating film 103, a groove portion 104a and a hole 104b corresponding to a pattern shape are formed. A wiring portion 104 that includes a trench wiring and a via wiring and is formed by Cu is disposed in the groove portion 104a and the hole 104b. The wiring portion 104 is electrically connected to the wiring layer 102.

Further, between the first insulating film 103 and the wiring portion 104, a Cu diffusion barrier film 104A is formed on the first insulating film 103, and an adhesion film 104B containing Pd is formed on the wiring portion 104. The Cu diffusion barrier film 104A prevents Cu from being diffused from the wiring portion 104 to the first insulating film 103. Further, a second insulating film 106 is formed to cover the top of the wiring portion 104 and that of the first insulating film 103. The present embodiment provides a method for forming an adhesion film and a Cu film by applying the film forming method of the present invention to the second insulating film 106. Further, the wiring portion 104 and the adhesion film 104B may be formed by the method of the present embodiment, which will be described below.

Figure 2B:
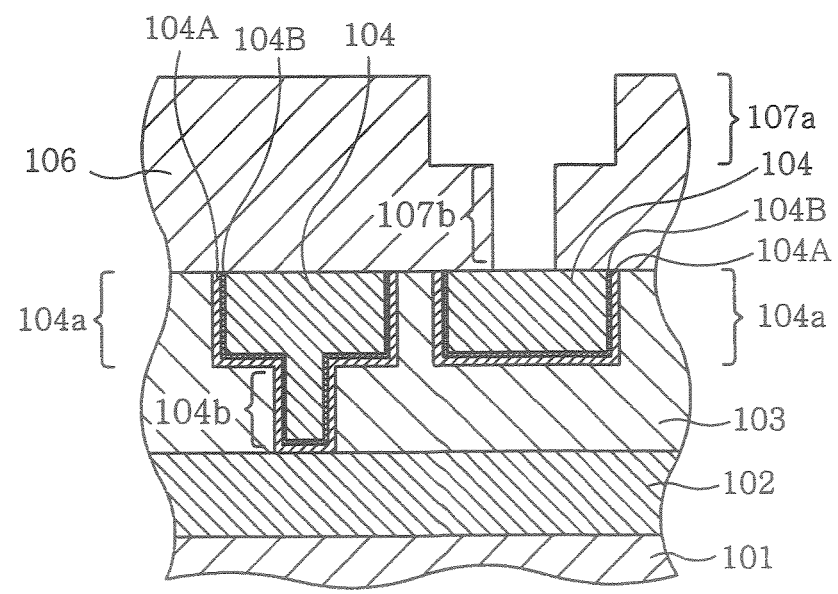
FIG. 2B presents a second one of the drawings for sequentially illustrating a method of manufacturing a semiconductor device in accordance with the first embodiment.

In a step shown in FIG. 2B, a pattern shape such as a groove portion 107a and a hole 107b are formed in the second insulating film 106 by using, e.g., a dry etching method.

Figure 2C:
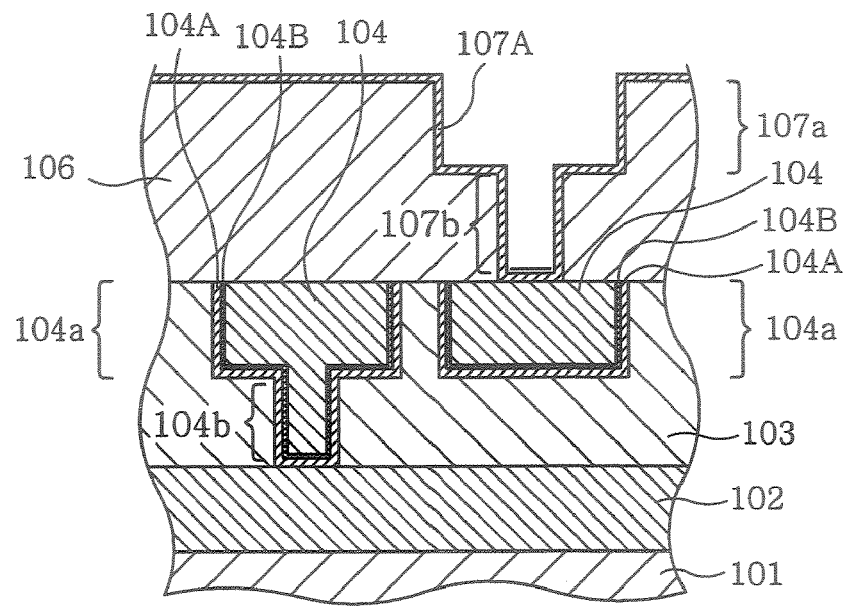
FIG. 2C provides a third one of the drawings for sequentially illustrating a method of manufacturing a semiconductor device in accordance with the first embodiment.

Thereafter, in a step shown in FIG. 2C, a Cu diffusion barrier film 107A is formed on the second insulating film 106 along the pattern shape like inner wall surfaces of the groove portion 107a and hole 107b, and as well as on an exposed surface of the wiring portion 104. In this case, the Cu diffusion barrier film 107A is formed of, for example, a TaN film by using, for example, a sputtering method.

Figure 2D:
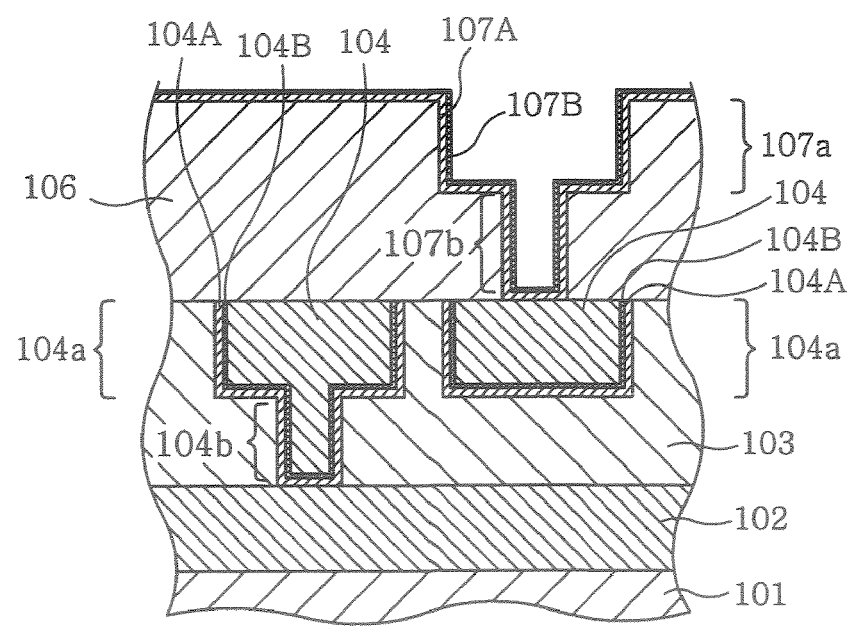
FIG. 2D shows a fourth one of the drawings for sequentially illustrating a method of manufacturing a semiconductor device in accordance with the first embodiment.

Next, in a step shown in FIG. 2D, an adhesion film 107B containing Pd is formed on the Cu diffusion barrier film 107A along the inner wall surfaces of the groove portion 107a and hole 107b by using, e.g., a PVD (Physical Vapor Deposition) method such as the sputtering method. Further, the adhesion film 107B may include Cu in addition to Pd. If the adhesion film 107B includes Pd and Cu, the adhesion between the adhesion film 107B and a Cu wiring portion to be formed on the adhesion film 107B, which will be described later, can be improved.

Further, the adhesion film 107B may be formed by various film forming methods, e.g., other methods than the PVD method such as a chemical vapor deposition (CVD) method, a method of alternately supplying a plurality of gases to the substrate to be processed (which is occasionally called as an ALD (Atomic Layer Deposition) method). Regarding an apparatus for forming the adhesion film 107B and a more specific film forming method, descriptions thereon will be given later with reference to FIG. 3 and following drawings.

Figure 2E:
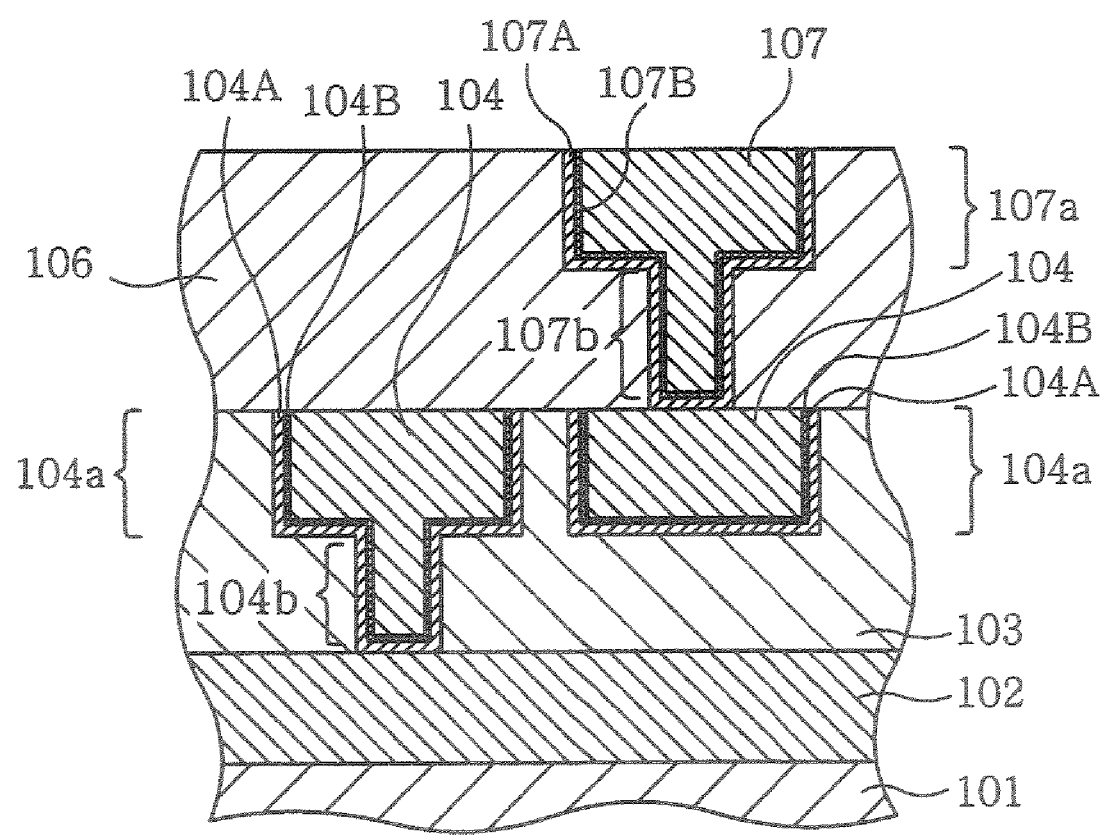
FIG. 2E is a fifth one of the drawings for sequentially illustrating a method of manufacturing a semiconductor device in accordance with the first embodiment.

Next in a step shown in FIG. 2E, a wiring portion 107 made of Cu is formed on the adhesion film 107B in which the groove portion 107a and the hole 107b are formed, such that wiring portion 107 fills up the groove portion 107a and the hole 107b. Further, the wiring portion 107 may be formed by various film forming methods, e.g., by the PVD method, the CVD method, the method (ALD method) of alternately supplying a plurality of gases to the substrate to be processed, a plating method, or a combination thereof.

In this case, the Cu film can be formed by a method of forming in advance a Cu film as a seed layer on the adhesion film 107B, and then depositing another Cu film on the seed layer. Otherwise, the Cu film may be deposited without forming any seed layer.

Further, the seed layer may be formed by, for example, the PVD method. Still further, it is preferable that the seed layer is formed by the CVD method, by which the seed layer can cover the adhesion film 107B more effectively. Still further, it is more preferable that the seed layer is formed by the method (ALD method) of alternately supplying a plurality of gases to the substrate to be processed, by which the adhesion film 107B can be covered by the seed layer still more effectively. As the method of depositing the Cu film after forming the seed layer, the PVD method, the CVD method, the method of alternately supplying a plurality of gases to the substrate to be processed or the like can be used; besides, the plating method can also be used. Further, in case of forming the Cu film by being deposited without forming any seed layer, the Cu film can be formed by the PVD method, the CVD method, or the method of alternately supplying a plurality of gases to the substrate to be processed.

The conventional prior art has a problem in that the adhesion between the Cu diffusion barrier film and the Cu film is weak. However, in accordance with the present embodiment, this problem can be solved such that the possibility of developing a peeling of the wiring portion made of Cu becomes low, thereby making it possible to form a multi-layer interconnection structure, and a semiconductor device as well, of high reliability.

Further, the wiring portion containing Cu may also be formed by, after the above-described step, forming (n+2) number of insulating films (where n is a natural number) on the second insulating film 106, and then applying the film forming method in accordance with the present invention to each of the insulating films.

Further, although the present embodiment has been described about a case where a stack layer made of TaN is used for the Cu diffusion barrier film, the present invention is not limited thereto, and it is also possible to use various kinds of Cu diffusion barrier film. That is, a layer made of a material selected from the group consisting of Ta, TaN, TaCNx, W, WN, WCNx, TiN, TaSiN and TiSiN, or a stacked layer including a combination thereof, can be, for example, used as the Cu diffusion barrier film. In case of using one of these Cu diffusion barrier films, the adhesion film containing Pd in accordance with the present embodiment has an advantageous effect in that the adhesion between the Cu wiring portion and the Cu diffusion barrier film can be enhanced.

Further, the first insulating film 103 or the second insulating film 106 may use various materials, for example, a silicon oxide film ($SiO_2$ film) a fluorinated silicon oxide film (SiOF film), a SiCO film, an organic macromolecular film such as a polymer film, or a porous film made by forming a large number of pores in one of these films.

Hereinafter, an example of a film forming apparatus for forming the adhesion film 107B will be described with reference to FIGS. 3 and 4.

Figure 3:
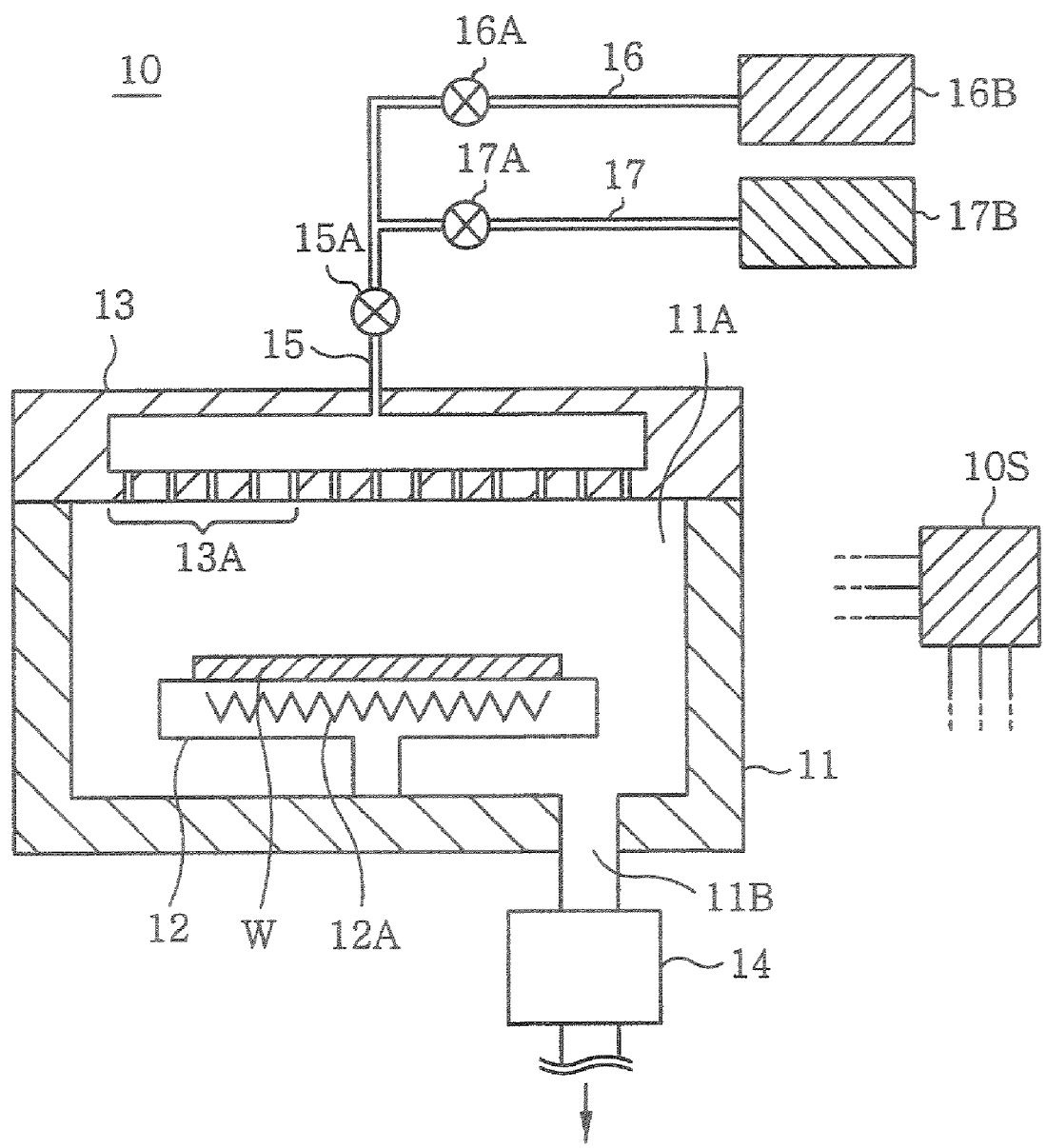
FIG. 3 illustrates an example of a CVD film forming apparatus capable of carrying out the film forming method in accordance with the first embodiment.

FIG. 3 shows a schematic diagram of a CVD film forming apparatus 10 as an example of an apparatus capable of forming the adhesion film in accordance with the present embodiment.

Referring to FIG. 3, the CVD film forming apparatus 10 includes a processing chamber 11 of a nearly cylindrical shape whose upper side is opened; and a supply unit 13 installed on top of the processing chamber 11 to cover the opened side of the processing chamber 11, wherein the supply unit 13 is, for example, a shower head structure.

A supporting table 12 for supporting a substrate W to be processed, such as a semiconductor wafer, is installed on a bottom portion of a processing space 11A, wherein the processing space 11A is an inner space of the processing chamber 11 defined by the processing chamber 11 and the supply unit 13. The supporting table 12 is provided with, e.g., a heating unit 12A, and is configured to heat the substrate to be processed.

Installed under the bottom portion of the processing chamber 11 is a gas exhaust unit 14 such as a vacuum pump or the like, which is connected to an exhaust port 11B, and is configured to be capable of exhausting the processing space. The processing space can be exhausted to be kept at, for example a depressurized state.

The supply unit 13 is connected to a supply line 15 in which a valve 15A is installed, and the supply line 15 is connected to a film forming gas supply line 16 and a reducing gas line 17. The film forming gas supply line 16, in which a valve 16A is installed, is connected to a film forming gas supply source 16B. The reducing gas line 17, in which a valve 17A is installed, is connected to a reducing gas supply source 17B.

When for example, supplying a film forming gas into the processing space 11A, the valves 16A and 15A are opened, and the film forming gas is supplied from the film forming gas supply source 16B via the supply unit 13. Likewise, when supplying a reducing gas into the processing space 11A, the valves 17A and 15A are opened, and the reducing gas is supplied from the reducing gas source 17B via the supply unit 13.

The film forming gas and the reducing gas supplied as above initiate chemical reactions on the heated substrate to be processed, so that the adhesion film can be formed on the substrate to be processed.

Further, an RF power, for example, may be applied to the supply unit 13 or the supporting table 12.

In case, for example, a Pd film is formed as the adhesion film including Pd formed on the Cu diffusion barrier film of the substrate to be processed, $Pd(hfac)_2$, $(C_5H_5)Pd(allyl)$ or $Pd(allyl)_2$ may be used for the film forming gas, and $H_2$ may be used for the reducing gas. Further, the film forming gas used in the CVD film forming apparatus may be obtained by vaporizing or sublimating a material that is in a liquid or solid state at a room temperature under an atmospheric pressure, and the material used for the film formation is occasionally called as a precursor.

Further, the Pd film formed by using the above-described film forming gas and the above-mentioned reducing gas may include a very small amount of impurities (for example, a very small amount of organic material and the like), and the term "Pd film" in the present embodiment should be construed to include such a case. Further, although the Pd film may be used by adding various kinds of additives if necessary, it is preferable that the adhesion film includes Pd as a main element thereof in order to secure the strong adhesion with respect to the Cu wiring portion.

Further, operations of the CVD film forming apparatus 10 for the film formation is controlled by a controller 10S including a storage medium (not shown) and a computer (not shown) The controller 10S, for example, controls the operations of opening and closing the valves 15A, 16A and 17A, adjusting the temperature of the heating unit 12A, and the like.

Further, the CVD film forming apparatus may be used for forming, for example, the Cu diffusion barrier film or the Cu film.

In case of, for example, forming the Cu film, the film forming gas may be made of the one selected from the group consisting of $Cu(hfac)_2$, $Cu(acac)_2$, $Cu(dpm)_2$, $Cu(dibm)_2$, $Cu(ibpm)_2$, $Cu(edmdd)_2$, $Cu(hfac)TMVS$ and $Cu(hfac)COD$. When forming the Cu wiring portion in the CVD film forming apparatus 10, the Cu film may be used for, e.g., forming a seed layer and depositing Cu after the seed layer has been formed, or depositing Cu to form the Cu wiring portion without forming a seed layer.

Figure 4:
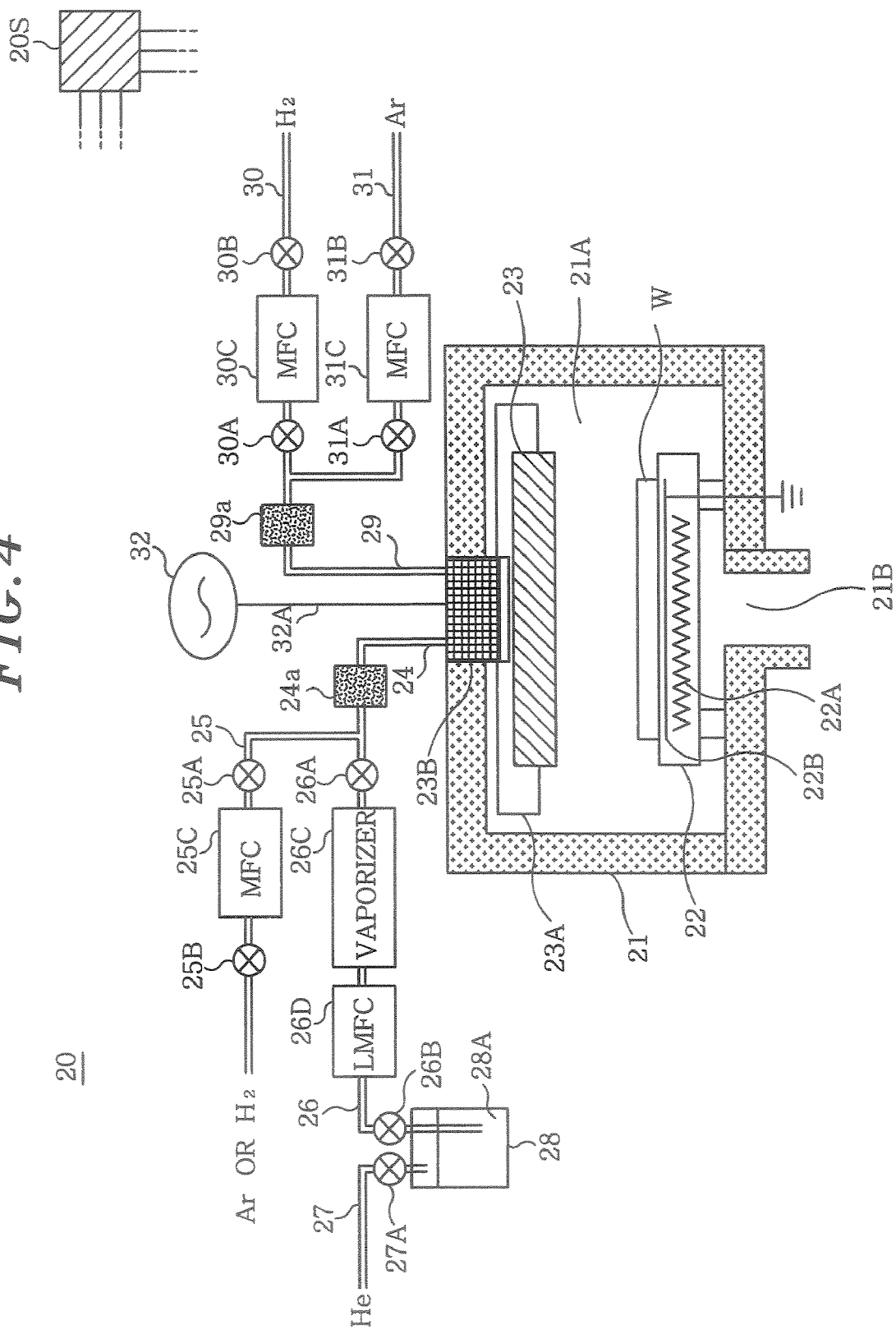
FIG. 4 depicts an example of an ALD film forming apparatus capable of carrying out the film forming method in accordance with the first embodiment.

FIG. 4 is a schematic diagram of an ALD film forming apparatus 20 as an example of the film forming apparatus capable of forming the adhesion film in accordance with the present embodiment.

Referring to FIG. 4, the ALD film forming apparatus 20 includes a processing chamber 21 for receiving a substrate W to be processed. A film forming gas and a reducing gas are supplied, via a gas line 24 and a gas line 29 respectively, to the substrate W to be processed in a processing space 21A formed in the processing chamber 21.

The film forming gas and the reducing gas are alternately supplied into the processing space 21A via the gas line 24 and the gas line 29. Thus, the film forming gas and the reducing gas are adsorbed onto a reaction surface of the substrate to be processed, and then form a film whose thickness is in the order of a nearly atomic or molecular level. By repeatedly performing these process steps in accordance with the so-called ALD method, it is possible to form a thin film with a specific thickness on the substrate W to be processed. When the film is formed by the ALD method as described above, even if a temperature of the film formation is low, impurities are small in amount so that a high-quality film can be obtained. Further, it is possible to, when forming a film in a micro pattern, enhance a coverage of the film.

Hereinafter, the film forming apparatus 20 will be described in detail. A substrate supporting table 22 of nearly a disk shape is installed in the processing chamber 21, and a semiconductor substrate W serving as the substrate to be processed is mounted on a central portion of the substrate supporting table 22. The substrate supporting table 22 includes a heating unit 22A including, e g., a heater, and is configured to be able to heat the substrate W at a desired temperature.

The processing space 21A in the substrate processing chamber 21 is vacuum exhausted by a gas exhaust unit (not shown) connected to an exhaust port 21B, so that the processing space 21A can be set in a depressurized state. The substrate W to be processed is carried into/out of in the processing chamber 21 through a gate valve (not shown) installed in the processing chamber 21.

The processing chamber 21 includes a shower head part 23 in a nearly cylindrical shape arranged to face the substrate supporting table 22, wherein the shower head part 23 is made of, for example, nickel or aluminum and the like. An insulator 23A including for example, quartz or ceramic such as SiN, AlN and the like, is provided on the sidewall surface of the shower head part 23 and between the shower head part 23 and the processing chamber 21.

Further, on a wall surface of the processing chamber 21 above the shower head part 23, an aperture is formed and an insulator 23B made of an insulating material is provided therein. An introductory line 32A, connected to a high frequency power supply 32, is inserted in to pass through the insulator 23B. Further, the introductory line 32A is connected to the shower head part 23, so that a high frequency power is applied to the shower head part 23 via the introductory line 32A.

Further, the gas line 24 for supplying a film forming gas into the processing space 21A and the gas line 29 for supplying a reducing gas into the processing space 21A are connected to the shower head part 23, so that the film forming gas and the reducing gas are supplied to the processing space 21A via the shower head part 23. Furthermore, insulators 24a and 29a are respectively provided in the gas lines 24 and 29 so that each of the gas lines is isolated from the high frequency power.

The gas line 24 is connected to a gas line 26 and a gas line 25, wherein the gas line 26 supplies the film forming gas to the gas line 24, and the gas line 25 supplies, for example, a purge gas or a carrier gas to the gas line 24.

Further, the gas line 29 is connected to a gas line 30 and a gas line 31, wherein the gas line 30 supplies a reducing gas to the gas line 29, and the gas line 31 supplies, for example, a purge gas or the like, to the gas line 29.

Firstly, the gas line 26 will be described. The gas line 26 is connected to a source material container 28 that stores a source material (precursor) 28A such as $Pd(hfac)_2$ or the like. Further, for example, a liquid mass flow controller 26D, an evaporator 26C and valves 26A and 26B are installed in the gas line 26. A gas line 27, in which a valve 27A is installed, is connected to the source material container 28, so that an inert gas, e.g., He, is introduced into the source material container 28, and the source material 28A is pressed out toward the gas line 26. A flow rate of the source material supplied to the gas line 26, which is, e.g., a liquid, is controlled by the liquid mass flow controller 26D, and is vaporized in the evaporator 26C to thereby become the film forming gas.

Further, the gas line 25 is connected to a gas supply source (not shown) for supplying, for example, an Ar gas and the like. A mass flow controller 25C and valves 25A and 25B are attached to the gas line 25. The carrier gas such as an Ar gas supplied through the gas line 25 and the film forming gas supplied through the gas line 26 are supplied into the processing space 21A through the gas line 24 via the shower head part 23.

Meanwhile, the gas line 30 connected to the gas line 29 is in turn connected to a supply source (not shown) of the reducing gas, e.g., a $H_2$ gas. A mass flow controller 30C and valves 30A and 30B are attached to the gas line 30 so that a flow rate of the reducing gas supplied to the gas line 29 is controlled.

The gas line 31 for supplying the purge gas to the gas line 29 is connected to a supply source of the purge gas such as an Ar gas. A mass flow controller 31C and valves 31A and 31B are attached to the gas line 31 so that a flow rate of the purge gas to be supplied is controlled.

Further, in case of forming a Pd film as an example of the adhesion film formed on the Cu diffusion barrier film on the substrate to be processed the film forming gas may be selected from the group consisting of $Pd(hfac)_2$, $(C_5H_5)Pd(allyl)$ and $Pd(allyl)_2$, and the reducing gas may be $H_2$. Further, the film forming gas used for the ALD film forming apparatus may be obtained by vaporizing or sublimating a source material that is in a liquid or solid state at a room temperature under an atmospheric pressure, and the source material used for the film formation is occasionally called as a precursor. In this case, if necessary, the precursor may be vaporized or sublimated for use.

Further, the ALD film forming apparatus may be used in forming, for example, the Cu diffusion barrier film or the Cu film.

In case of, for example, forming the Cu film, the film forming gas may be the one selected from the group consisting of $Cu(hfac)_2$, $Cu(acac)_2$, $Cu(dpm)_2$, $Cu(dibm)_2$, $Cu(ibpm)_2$, $Cu(edmdd)_2$, $Cu(hfac)TMVS$ and $Cu(hfac)COD$. In case of, for example, forming the Cu wiring portion by the film forming apparatus 20, the Cu wiring portion may be formed by forming a seed layer, or depositing Cu without forming a seed layer.

Further, operations of the film forming apparatus 20 for forming a film is controlled by a controller 20S incorporating therein a storage medium and a computer (CPU). The controller 20S controls operations of, e.g., opening and closing the valves 25A, 25B, 26A, 26B, 27A, 30A, 30B, 31A and 31B, adjusting a temperature of the heating unit 22A, driving the high frequency power supply 32, and the like. Further, the operations of the controller 20S are executed by a program stored in the storage medium.

Figure 5:
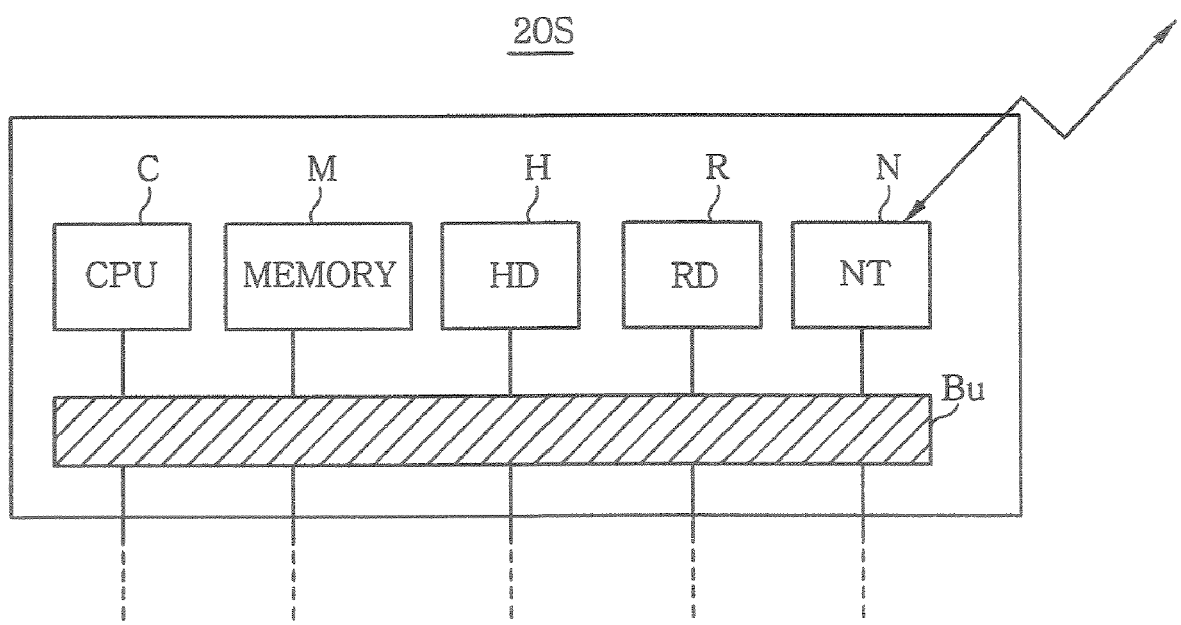
FIG. 5 describes a configuration of a controller used in the apparatus shown in FIG. 4.

FIG. 5 is a schematic diagram of the controller 20S. Referring to FIG. 5, the controller 20S includes a CPU (computer) C, a memory M, a storage medium H such as a hard disk, a storage medium R that is separable, and a network connection unit N, and a bus Bu that connects these components. The bus Bu is connected to, for example a valve or a heating unit. The storage medium H stores a program for operating the film forming apparatus. However, the program may also be inputted via, for example, the storage medium R or the network connection unit NT.

In case of, for example, forming the adhesion film, the Cu film or the like by using the ALD film forming apparatus 20 the controller 20S operates the ALD film forming apparatus 20 as described below in accordance with the program (that is occasionally called as a recipe) stored in the storage medium H.

Figure 6:
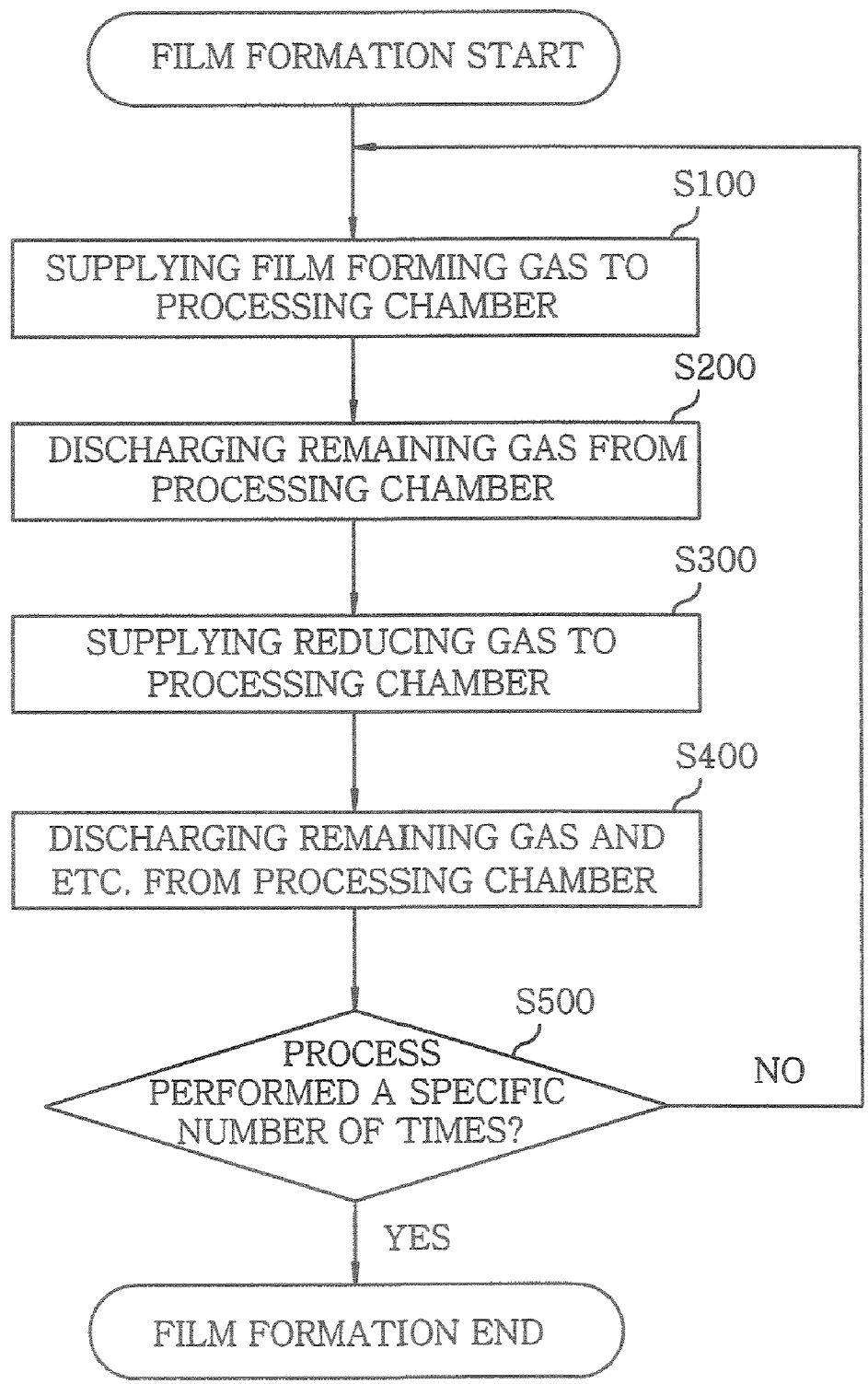
FIG. 6 offers a first flow chart for representing a method of performing a film formation by using the apparatus shown in FIG. 4.
Figure 7:
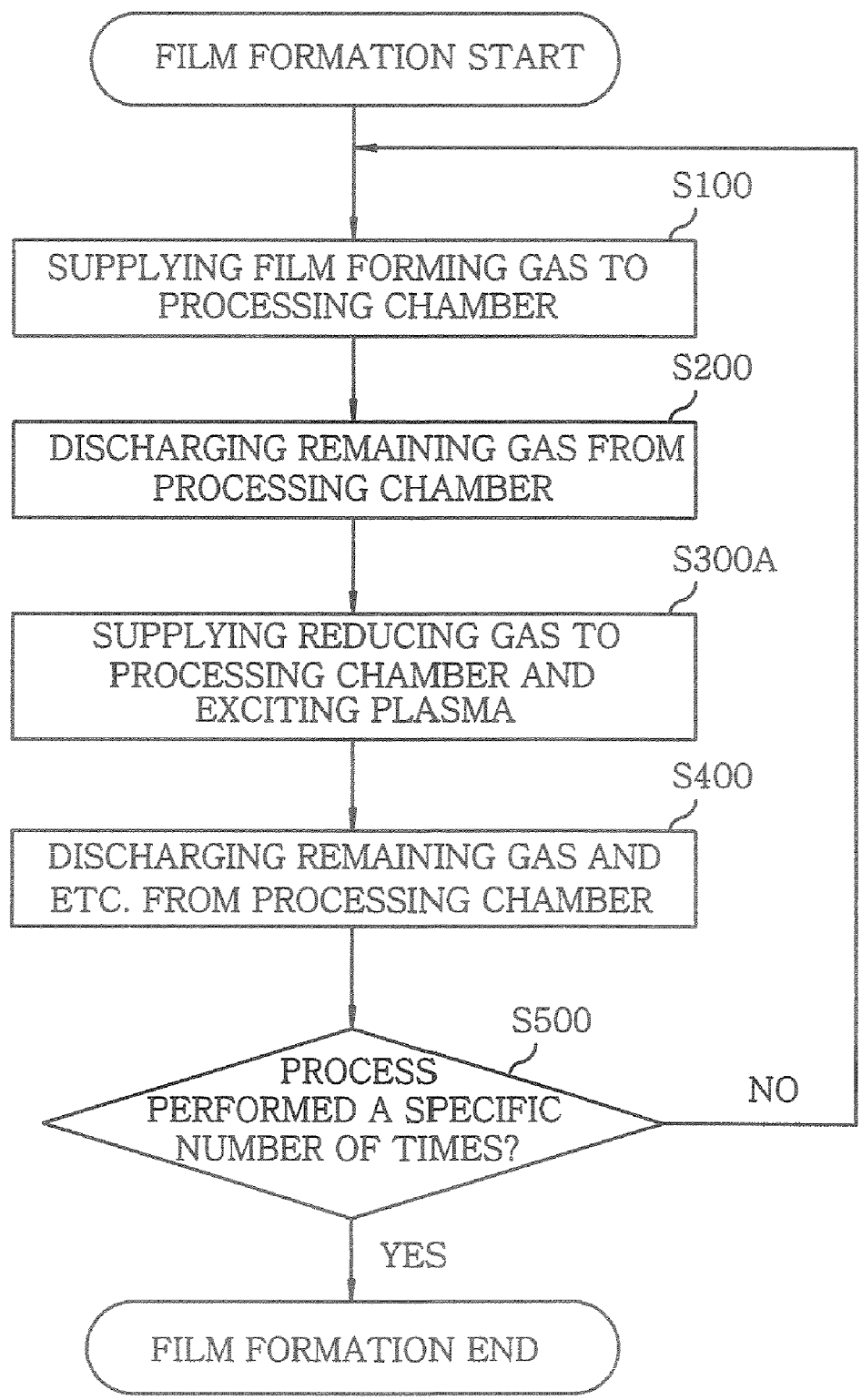
FIG. 7 provides a second flow chart for representing the method of performing the film formation by using the apparatus shown in FIG. 4.

As an example, specific operations for forming the adhesion film by using the ALD film forming apparatus 20 are depicted in flow charts of FIGS. 6 and 7.

Firstly, referring to FIG. 6, the film forming process is started, and the valves 25A, 25B, 26A, 26B and 27A are opened in step S100, so that the vaporized source material 28A is, together with Ar supplied via the gas line 25, supplied to the processing space 21A via the gas line 24.

In this step, the film forming gas such as $Pd(hfac)_2$ is supplied to the substrate to be processed, and is adsorbed onto the substrate.

In step S200, the valves 25A, 25B, 26A, 26B and 27A are closed so that the supply of the film forming gas into the processing space 21A is stopped. Then a part of the film forming gas that is not adsorbed onto the substrate and remains in the processing space 21 is discharged to an outside of the processing chamber 21A through the exhaust port 21B. At this time, the valves 25A and 25B and the valves 31A and 31B may be opened to introduce, respectively via the gas lines 24 and 29, the Ar gas serving as the purge gas to thereby purge the processing space 21A. In this case, the remaining film forming gas is quickly discharged from the processing space 21A. When the purge is completed after a specific period of time, the valves 25A and 25B and the valves 31A and 31B are closed.

Next, in step S300, the valves 30A and 30B are opened, and the $H_2$ gas serving as the reducing gas whose flow rate is controlled by the mass flow controller 30C, is supplied via the gas line 29 into the processing space 21A to initiate chemical reactions with the film forming gas of $Pd(hfac)_2$ adsorbed on the substrate W to be processed. Thus for example, a Pd film is formed on the Cu diffusion barrier film formed on the substrate W to be processed.

Thereafter, in step S400, the valves 30A and 30B are closed so that the supply of the reducing gas into the processing space 21A is stopped. Then, a part of the reducing gas, that has not reacted with the film forming gas on the substrate and remains in the processing space 21A, is discharged to the outside of the processing chamber 21 via the exhaust port 21B. At this time, the valves 25A and 25B and the valves 31A and 31B may be opened to introduce, respectively through the gas lines 24 and 29, the Ar gas as the purge gas to thereby purge the processing space 21A. In this case, the remaining reducing gas, byproducts thereof and the like are quickly discharged from the processing space 21A. When the purge is completed after a specific period of time, the valves 25A and 25B and the valves 31A and 31B are closed.

Next, in step S500, the film forming process is, if necessary, returned to the step S100 in order to form a thin film of a required thickness on the substrate to be processed. The film forming process from steps S100 to S400 in accordance with the ALD method is repeated until the thin film is formed with a required thickness. Thereafter, the film formation is terminated.

The film formed by the ALD method has a good film quality, because impurities in the film are small in amount. Further, the coverage of the film is enhanced in case the film is formed along a pattern shape.

Further, the film forming method shown in FIG. 6 may be modified to that shown in FIG. 7, which is an example of a modified flow chart of the film forming method modified from that of FIG. 6. In the drawings, same parts will be indicated by same reference numerals, and the descriptions thereof will be omitted.

Referring to FIG. 7, in step S300A that corresponds to step S300 in FIG. 6, in addition to performing the operation of step S300 in FIG. 6, the high frequency power is supplied from the high frequency power supply 32 to the shower head part 23, and plasma is excited in the processing space 21A. At this step, since $H_2$ in the processing space is dissociated into H+/H* (hydrogen ions and hydrogen radicals), chemical reactions between hydrogen and the film forming gas (Pd (hfac)$_2$) adsorbed on the substrate W are expedited. Thus, the Pd film can be formed more efficiently. In this manner, it is also possible that, if necessary, the gas is made to be dissociated by applying the high frequency power from the high frequency power supply 32 and exciting the plasma in the processing space.

Hereinafter, there will be given descriptions about SEM (Scanning Electron Microscope) images that show a Cu film formed on a Cu diffusion barrier film by using the film forming method in accordance with the present embodiment.

Figure 8A:
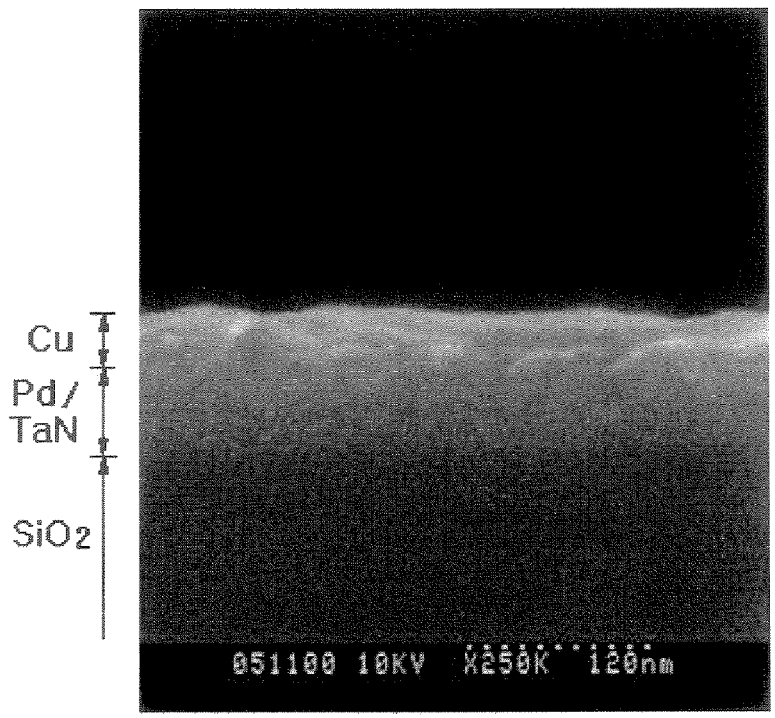
FIG. 8A presents a first SEM image of a Cu film formed on a Cu diffusion barrier film.
Figure 8B:
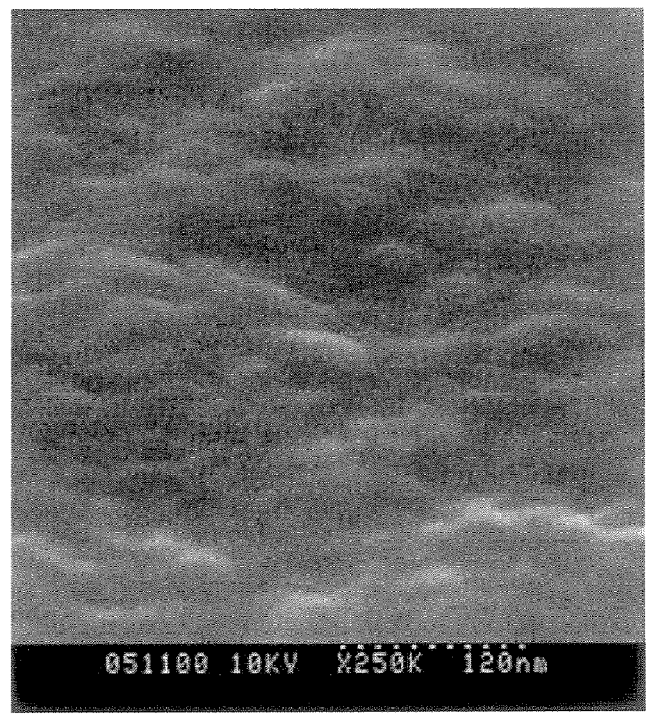
FIG. 8B offers a second SEM image of the Cu film formed on the Cu diffusion barrier film.

FIG. 8A is an SEM image showing a sectional view of a Cu film formed as follows: forming a TaN film as the Cu diffusion barrier film on a silicon oxide film ($SiO_2$ film) forming a Pd film as the adhesion film by using the film forming method of the present embodiment in which $Pd(hfac)_2$ is used as a precursor, and forming the Cu film on the adhesion film. FIG. 8B is an SEM image showing an oblique view (a view seen from a side of the Cu film) of the structure shown in FIG. 8A.

Referring to FIGS. 8A and 8B, it can be seen that a film peeling or agglomeration is suppressed on the Cu diffusion barrier film, and the Cu film formed in a good state.

Figure 9A:
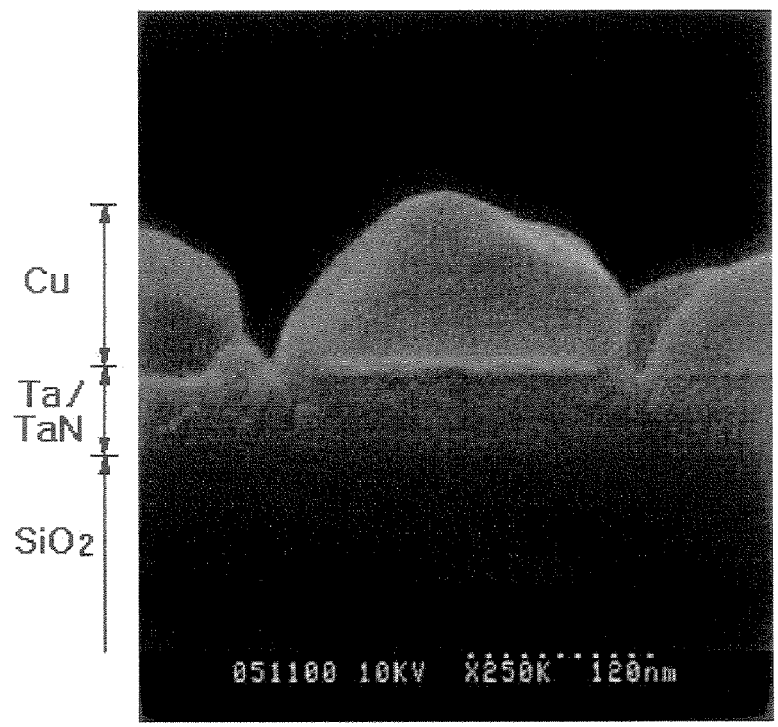
FIG. 9A provides a third SEM image of the Cu film formed on the Cu diffusion barrier film.
Figure 9B:
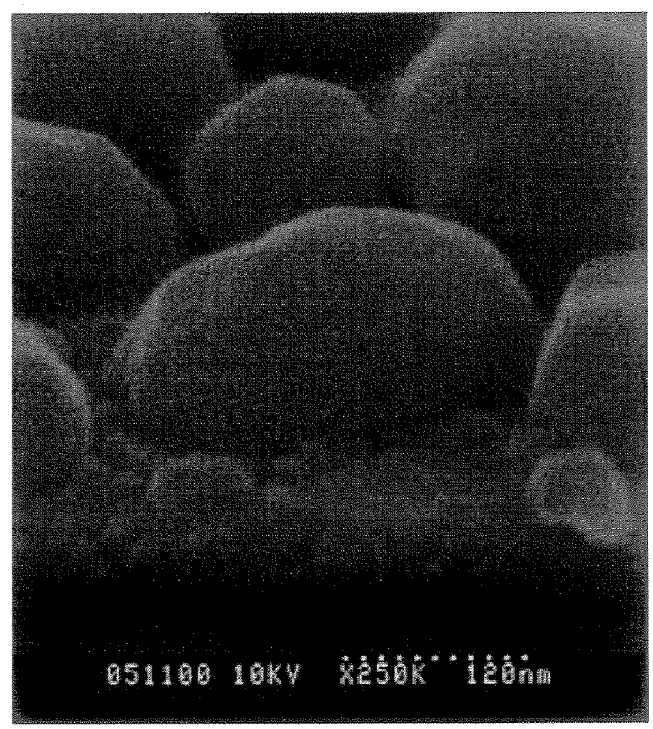
FIG. 9B sets forth a fourth SEM image of the Cu film formed on the Cu diffusion barrier film.

Further, FIG. 9A is an SEM image showing a sectional view of a Cu film formed without forming any adhesion film, wherein, after a Ta/TaN film is formed as the Cu diffusion barrier film on a silicon oxide film, the Cu film is formed on the Ta/TaN film. FIG. 9B is an SEM image showing an oblique view (a view seen from a side of the Cu film) of the structure shown in FIG. 9A.

Referring to FIGS. 9A and 9B, it can be understood that, if no adhesion film is formed on the Cu diffusion barrier film, an agglomeration of Cu, for example, may occur as shown in the SEM image, and the adhesion between the Cu film and the Cu diffusion barrier film is difficult to be secured. Further, in this case, there may develop a problem in a tolerance against an electromigration.

Figure 10A:
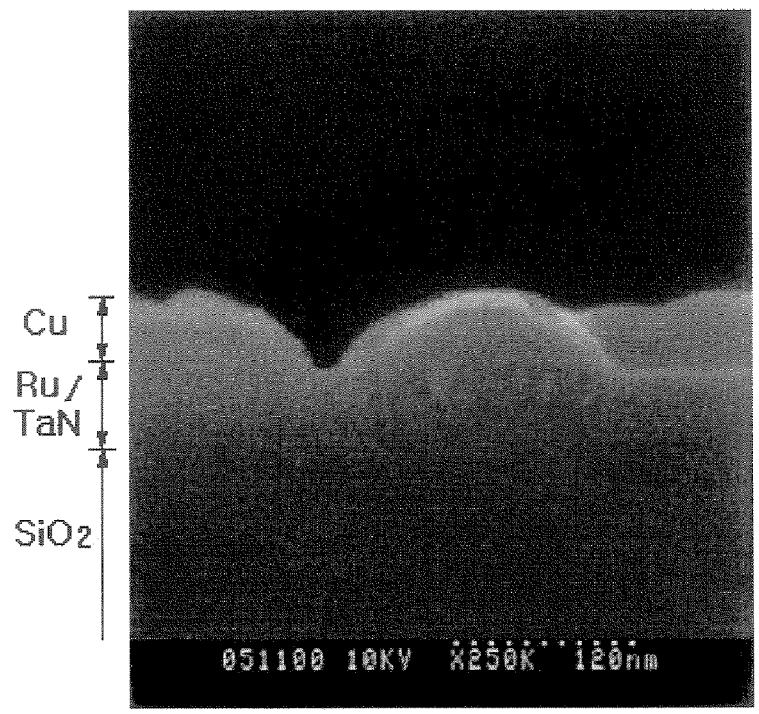
FIG. 10A presents a fifth SEM image of the Cu film is formed on the Cu diffusion barrier film.
Figure 10B:
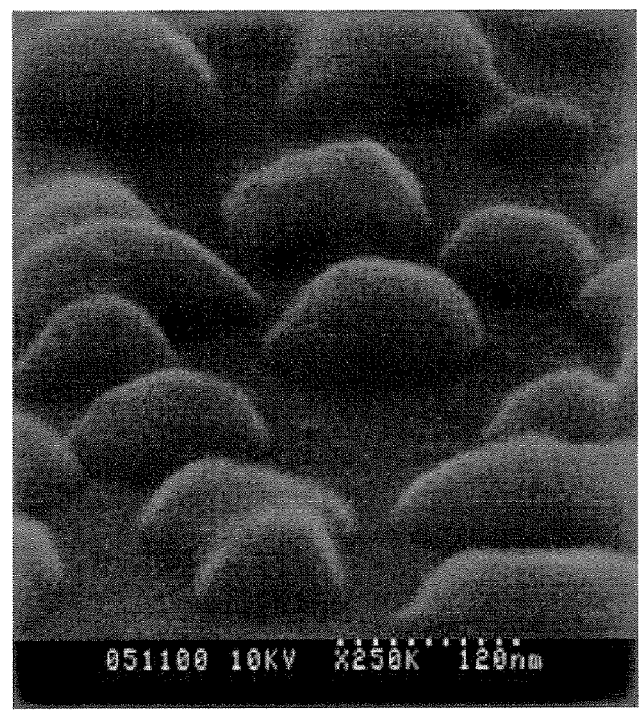
FIG. 10B provides a sixth SEM image of the Cu film formed on the Cu diffusion barrier film.

Further, FIG. 10A is an SEM image showing a sectional view of the Cu film formed as follows: forming a TaN film as the Cu diffusion barrier film on a silicon oxide film, forming a Ru film on the TaN film, and forming the Cu film on the Ru film. FIG. 10B is an SEM image showing an oblique view (a view seen from a side of the Cu film) of the structure shown in FIG. 10A.

Referring to FIGS. 10A and 10B, in a case where the Ru film is formed on the Cu diffusion barrier film and the Cu film is formed on the Ru film, the agglomeration of Cu is reduced compared to a case where no adhesion film is formed. However, in this case, the effect of reducing the Cu agglomeration is not sufficient, and it is observed that some part of Cu is agglomerated in an island shape. It can be deduced that, in this state, the adhesion between the Cu diffusion barrier film and the Cu film is difficult to be secured. Moreover, in case of forming the Cu film in this manner, a tolerance in electromigration thereof may be deteriorated.

As can be seen from FIGS. 8A to 10B, by forming the adhesion film including Pd by the film forming method in accordance with the present embodiment, the agglomeration of Cu is suppressed when the Cu film is formed on the Cu diffusion barrier film. Therefore, the adhesion between the Cu film and the Cu diffusion barrier film is improved. Further, in this case, it is conjectured that the tolerance in the electromigration or stress migration is also improved.

Although, in the above, the invention has been shown and described with respect to the above embodiment, the present invention is not limited thereto, but various changes and modifications may be made without departing from the scope of ideas disclosed in the claims.

INDUSTRIAL APPLICABILITY

In accordance with the present invention, the adhesion between the Cu diffusion barrier film and the Cu wiring in the semiconductor device can be improved, and the reliability of the semiconductor device can be enhanced.

What is claimed is:

1. A film forming method of forming a Cu film on a substrate to be processed, comprising:
   a first step of forming an adhesion film on a Cu diffusion barrier film formed on the substrate to be processed; and
   a second step of forming the Cu film on the adhesion film, wherein
   the adhesion film includes Pd,
   the adhesion film is formed by a chemical vapor deposition (CVD) method with a Pd film forming gas and a Pd reducing gas, the Cu film is formed by a CVD method with a Cu film forming gas and a Cu reducing gas, and the Cu film forming gas is selected from a group consisting of Cu(hfac)$_2$, Cu(acac)$_2$, Cu(dpm)$_2$, Cu(dibm)$_2$, Cu(ibpm)$_2$, Cu(edmdd)$_2$, Cu(hfac)TMVS and Cu(hfac)COD.

2. The film forming method of claim 1, wherein the adhesion film includes Cu.

3. The film forming method of claim 1, wherein the Cu diffusion barrier film is formed to cover an insulating film formed on the substrate to be processed.

4. The film forming method of claim 3, wherein a pattern shape is formed in the insulating film, and the Cu diffusion barrier film is formed along the pattern shape.

5. The film forming method of claim 1, wherein the Pd film forming gas is any one of Pd(hfac)$_2$, (C$_5$H$_5$)Pd(allyl) and Pd(allyl)$_2$.

6. The film forming method of claim 1, wherein the first step includes:
- a Pd film forming gas supplying step of supplying the Pd film forming gas to the substrate to be processed;
- a Pd film forming gas removing step of removing the Pd film forming gas over the substrate to be processed;
- a Pd reducing gas supplying step of supplying the Pd reducing gas to the substrate to be processed; and
- a Pd reducing gas removing step of removing the Pd reducing gas over the substrate to be processed.

7. The film forming method of claim 6, wherein the Pd film forming gas is any one of Pd(hfac)$_2$, (C$_5$H$_5$)Pd(allyl) and Pd(allyl)$_2$.

8. The film forming method of claim 6, wherein the Pd reducing gas is used by exciting plasma.

9. The film forming method of claim 1, wherein the second step includes:
- a Cu film forming gas supplying step of supplying the Cu film forming gas to the substrate to be processed;
- a Cu film forming gas removing step of removing the Cu film forming gas over the substrate to be processed;
- a Cu reducing gas supplying step of supplying the Cu reducing gas to the substrate to be processed; and
- a Cu reducing gas removing step of removing the Cu reducing gas over the substrate to be processed.

10. The film forming method of claim 9, wherein the Cu reducing gas is used by exciting plasma.

11. A method of manufacturing a semiconductor device having a Cu wiring portion, comprising:

a first step of forming an adhesion film on a Cu diffusion barrier film formed along a pattern shape formed in an insulating film on a substrate to be processed; and a second step of forming the Cu wiring portion on the adhesion film, wherein the adhesion film includes Pd, the adhesion film is formed by a chemical vapor deposition (CVD) method with a Pd film forming gas and a Pd reducing gas, an entire or a part of the Cu wiring portion is formed by a CVD method with Cu film forming gas and a Cu reducing gas, and the Cu film forming gas is selected from a group consisting of Cu(hfac)$_2$, Cu(acac), Cu(dpm)$_2$, Cu(dibm)$_2$, Cu(ibpm)$_2$, Cu(edmdd)$_2$, Cu(hfac)TMVS and Cu(hfac)COD.

12. The method of claim 11, wherein the adhesion film includes Cu.

13. The method of claim 11, wherein the Pd film forming gas is any one of Pd(hfac)$_2$, (C$_5$H$_5$)Pd(allyl) and Pd(allyl)$_2$.

14. The method of claim 11, wherein the first step includes:
- a Pd film forming gas supplying step of supplying the Pd film forming gas to the substrate to be processed;
- a Pd film forming gas removing step of removing the Pd film forming gas over the substrate to be processed;
- a Pd reducing gas supplying step of supplying the Pd reducing gas to the substrate to be processed; and
- a Pd reducing gas removing step of removing the Pd reducing gas over the substrate to be processed.

15. The method of claim 14, wherein the Pd film forming gas is any one of Pd(hfac)$_2$, (C$_5$H$_5$)Pd(allyl) and Pd(allyl)$_2$.

16. The method of claim 14, wherein the Pd reducing gas is used by exciting plasma.

17. The method of claim 11, wherein the second step includes:
- a Cu film forming gas supplying step of supplying the Cu film forming gas to the substrate to be processed;
- a Cu film forming gas removing step of removing the Cu film forming gas over the substrate to be processed;
- a Cu reducing gas supplying step of supplying the Cu reducing gas to the substrate to be processed; and
- a Cu reducing gas removing step of removing the Cu reducing gas over the substrate to be processed.

18. The method of claim 17, wherein the Cu reducing gas is used by exciting plasma.

* * * * *